US007709872B2

(12) United States Patent
Shiau et al.

(10) Patent No.: US 7,709,872 B2
(45) Date of Patent: May 4, 2010

(54) METHODS FOR FABRICATING IMAGE SENSOR DEVICES

(75) Inventors: Gwo-Yuh Shiau, Hsinchu (TW); Ming-Chyi Liu, Hsinchu (TW); Yuan-Chih Hsieh, Hsinchu (TW); Shih-Chi Fu, Taipei (TW); Chia-Shiung Tsai, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 722 days.

(21) Appl. No.: 11/531,290

(22) Filed: Sep. 13, 2006

(65) Prior Publication Data

US 2008/0061330 A1 Mar. 13, 2008

(51) Int. Cl.
*H01L 31/0232* (2006.01)

(52) U.S. Cl. ............... 257/294; 257/444; 257/E31.121; 438/459; 438/70; 438/75

(58) Field of Classification Search .......... 257/E31.121, 257/294, E31.123, 444, 435; 438/70, 75, 438/459
See application file for complete search history.

(56) References Cited

U.S. PATENT DOCUMENTS

2003/0122209 A1* 7/2003 Uya ........................... 257/435
2005/0074954 A1* 4/2005 Yamanaka ................. 438/458

* cited by examiner

*Primary Examiner*—David Vu
*Assistant Examiner*—Earl N Taylor
(74) *Attorney, Agent, or Firm*—Thomas, Kayden, Horstemeyer & Risley

(57) ABSTRACT

Image sensor devices and methods for fabricating the same are provided. An exemplary embodiment of an image sensor device comprises a support substrate. A passivation structure is formed over the support substrate. An interconnect structure is formed over the passivation structure. A first semiconductor layer is formed over the interconnect structure, having a first and second surfaces, wherein the first and second surfaces are opposing surfaces. At least one light-sensing device is formed over/in the first semiconductor layer from a first surface thereof. A color filter layer is formed over the first semiconductor layer from a second surface thereof. At least one micro lens is formed over the color filter layer.

16 Claims, 7 Drawing Sheets

METHODS FOR FABRICATING IMAGE SENSOR DEVICES

BACKGROUND OF THE INVENTION

1. Field of the Invention

The invention relates to image sensor device fabrication, and more particularly relates to a method for fabricating an image sensor device capable of light illumination from a back side of a substrate therein.

2. Description of the Related Art

An image sensor includes a grid of pixels comprising elements such as photodiodes, reset transistors, source follower transistors, pinned layer photodiodes, and/or transfer transistors for recording an intensity or brightness of an incident light. Each of the pixels responds to the incident light by accumulating a charge. The more incident light, the higher the charge. The charge can then be used by another circuit so that a color and brightness can be used for a suitable application, such as a digital camera. Common types of pixel grids include a charge couple device (CCD) or complimentary metal oxide semiconductor (CMOS) image sensor.

Typically, an image sensor is a semiconductor device converting an optical image to an electrical signal. Among the above mentioned image sensors, the CCD image sensor comprises a plurality of metal-oxide-silicon (MOS) capacitors for storage and transfer of charge carriers. The CMOS image sensor, a product of CMOS manufacturing technology, is a semiconductor device that converts an optical image to an electrical signal using a switching scheme of a MOS transistor for transportation of photo-electric charges from a photodiode to an output node as well as detection of an output signal at the output node.

FIG. 1 is a cross section showing a CMOS image sensor having a plurality of microlenses therein as disclosed in U.S. Pat. No. 6,979,588 (issued to Jeong et al.). As shown in FIG. 1, the CMOS image sensor includes a semiconductor substrate 10 with a plurality of isolation regions 12 formed therein, defining a plurality of pixel regions. A photodiode 14 for converting an incident light to photo-charges is formed in a corresponding pixel region. For the sake of convenience, transistors required for the unit pixel is not depicted in the drawings. An interlayer dielectric (ILD) 16 is formed on the semiconductor substrate 10, thereby metal interconnects 18 are provided at predetermined locations of the ILD 16 to prevent shielding of incident light on the underlying photodiodes 14. A passivation layer 20 is formed over the metal interconnects 18 for protecting a device from moisture and scratching during post-manufacturing processes. In addition, color filter array 22 having red, green and blue color filters are formed directly on the passivation layer 20. An over-coating layer (OCL) 24 is providing on the color filter array 22, thereby providing a planarized surface. A plurality of dome shaped microlens 26 is formed on the OCL 24, substantially corresponding to each of the pixel regions. Therefore, incident light 30 projected onto the photodiodes 14 can pass through the internal structures formed between the photodiodes 14 and the microlenses 26 along an optical path L1.

Nevertheless, with the trend toward size reduction of pixel units formed on a substrate, optical interference such as refraction, reflection, diffraction and light absorption may occur during the progress of the incident light 30 along the optical path L1 by the metal interconnect structures and the materials formed therein, thereby affecting the quantum efficiency of the photodiodes 14 and cross-talk may thus occur between adjacent pixel units.

BRIEF SUMMARY OF THE INVENTION

Therefore, image sensor devices of better performance with reduced-size are desired.

Image sensor devices and methods for fabricating the same are provided. An exemplary embodiment of an image sensor device comprises a support substrate. A passivation structure is formed over the support substrate. An interconnect structure is formed over the passivation structure. A first semiconductor layer is formed over the interconnect structure, having a first and second surfaces, wherein the first and second surfaces are opposing surfaces. At least one light-sensing device is formed over/in the first semiconductor layer from a first surface thereof. A color filter layer is formed over the first semiconductor layer from a second surface thereof. At least one micro lens is formed over the color filter layer.

An exemplary embodiment of a method for fabricating an image sensor device comprises providing a first substrate having a first semiconductor layer thereon, wherein the first substrate and the first semiconductor layer are formed with same conductivity but different doping concentrations and the first semiconductor layer has a first surface not contacting the first substrate and a second surface contacting the first substrate, wherein the first and second surfaces are opposing surfaces and the first surface contacts the interconnect structure. At least one light-sensing device is formed over/in the first semiconductor layer from the first surface thereof. An interconnect structure is formed over of the first semiconductor layer, covering the light-sensing device. A passivation structure is formed over the interconnect structure, covering the interconnect structure. A second substrate is bonded with the passivation structure. The first substrate is thinned, exposing the second surface of the first semiconductor layer. A color filter layer is formed over the first semiconductor layer from the second surface thereof. At least one micro lens is formed over the color filter layer.

Another exemplary embodiment of a method for fabricating an image sensor device comprises providing a first substrate having a first and second semiconductor layers sequentially stacked on the substrate, wherein the first substrate, and the first and second semiconductor layers are formed with same conductivity but different doping concentrations and the first semiconductor layer has a first surface contacting the second semiconductor layer and a second surface contacting the first substrate. At least one light-sensing device is formed over/in the second semiconductor layer. An interconnect structure is formed over the first substrate, covering and the light-sensing device. A passivation structure is formed over the interconnect structure. A second substrate is bonded with the passivation structure. The first substrate is thinned and exposes the second surface of the first semiconductor layer. A color filter layer is formed over the first semiconductor layer from the second surface thereof. At least one microlens is formed over the color filter layer.

Yet another exemplary embodiment of a method for fabricating an image sensor device comprises providing a semiconductor on insulator (SOI) substrate having a first semiconductor layer formed thereon, wherein the SOI substrate comprises a stack of a bulk substrate with an insulating layer and a second semiconductor layer sequentially formed thereon, the first semiconductor layer is formed over the second semiconductor layer, the first and second semiconductor layers are formed with same conductivity but different doping concentrations, and the insulating layer has a first surface contacting the second semiconductor layer and a second surface contacting the bulk substrate. At least one light-sensing device is formed over/in the first semiconductor layer.

An interconnect structure is formed over the first semiconductor layer, covering the light-sensing device. A passivation structure is formed over the interconnect structure. A second substrate is bonded with the passivation structure. The bulk substrate is removed, exposing the second surface of the insulating layer. A color filter layer is formed over the insulating layer from the second surface thereof. At least one microlens is formed over the color filter layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Methods for fabricating image sensor devices will now be described in greater detail in the following. Some embodiments of the invention, such as the exemplary embodiments described, can potentially reduce optical interference and improve quantum efficiency of the light-sensing device formed within an image sensor device, especially when a size thereof is further reduced. In some embodiments, this can be accomplished by thinning a backside of a semiconductor substrate thereof, comprising light-sensing devices, and forming a color filter layer and micro lenses on the thinned semiconductor substrate.

Figure 2A:
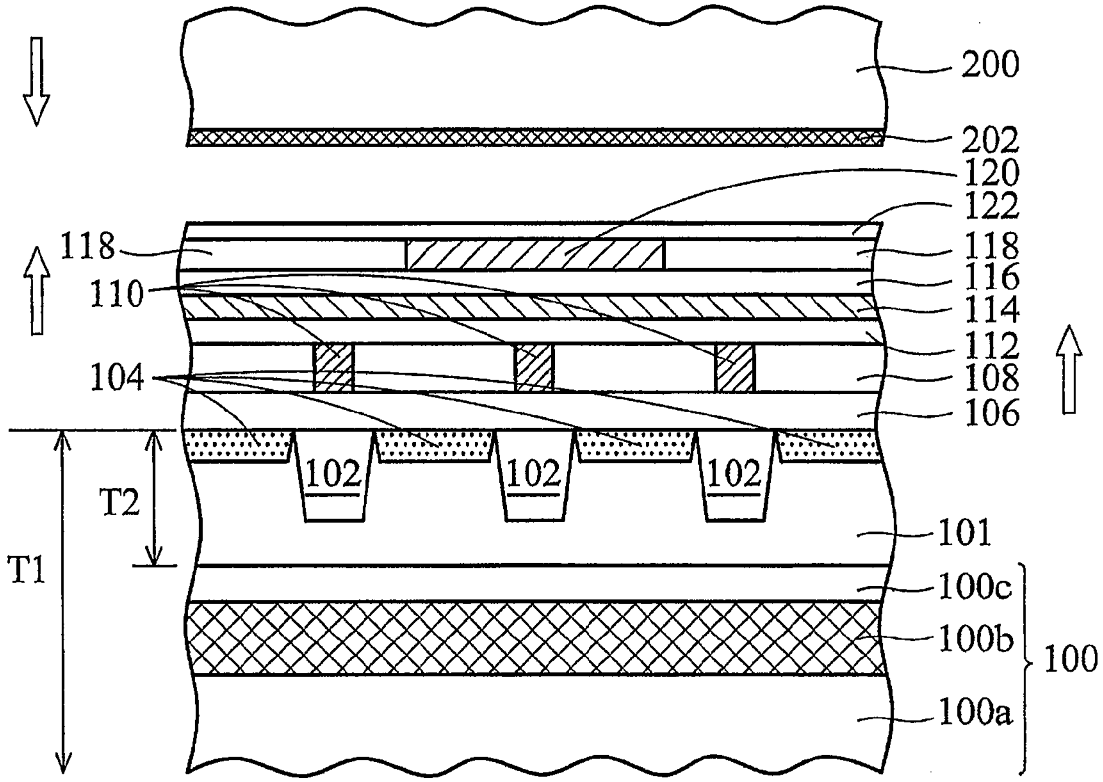
FIGS. 2*a*-2*c* are schematic cross sections showing an embodiment of a method for fabricating an image sensor device.
Figure 2B:
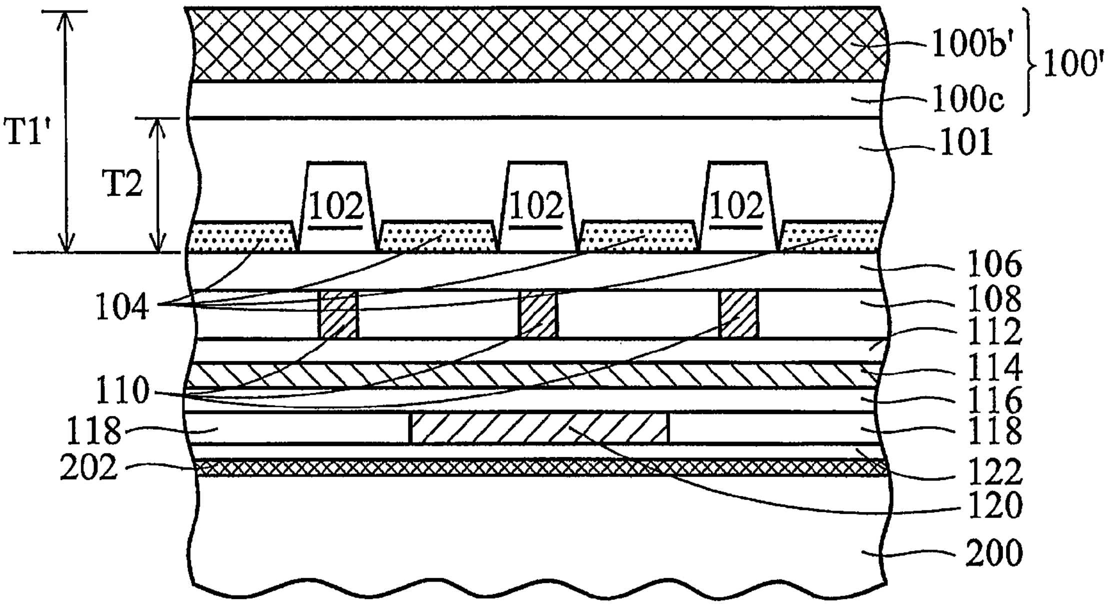
Figure 2C:
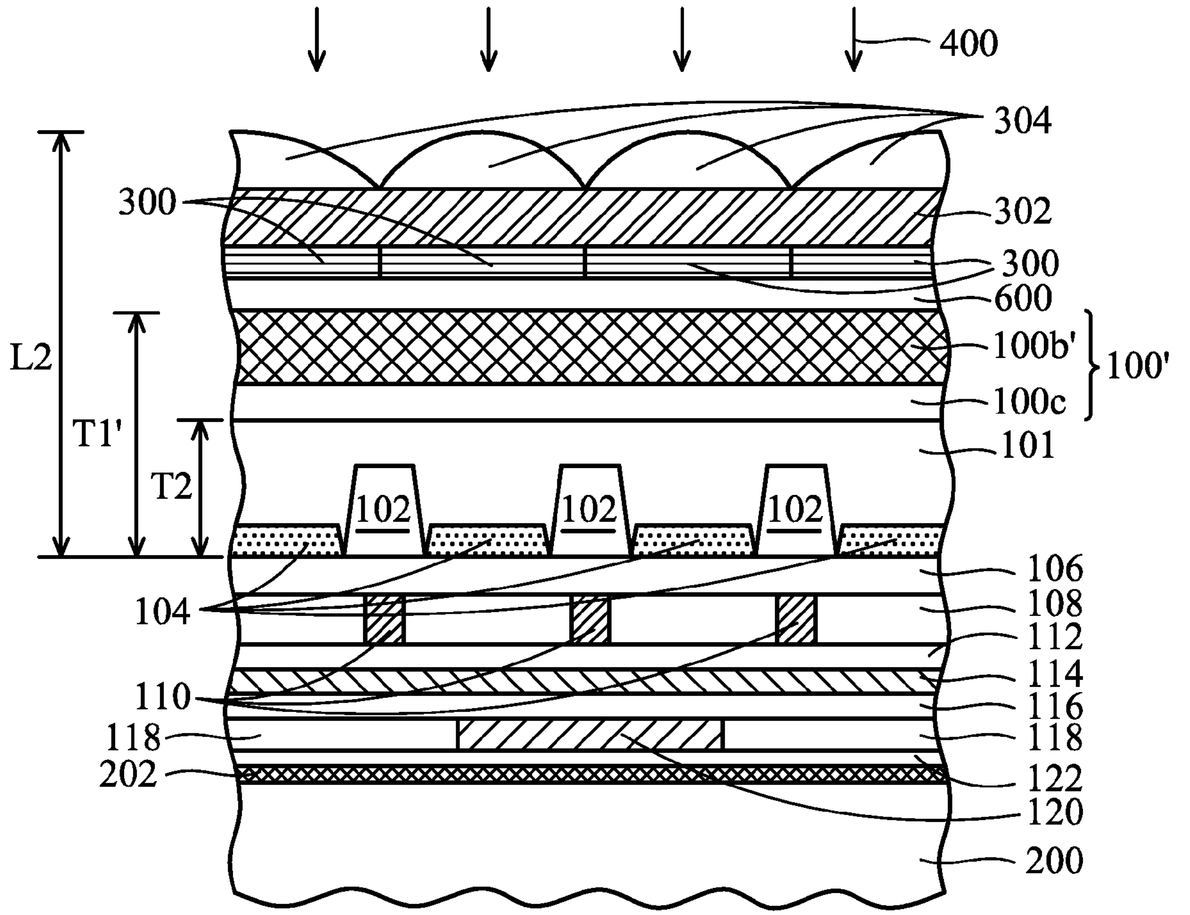

FIGS. 2*a*-2*c* are schematic cross sections showing an embodiment of a method for fabricating an image sensor device.

As shown in FIG. 2*a*, a nearly fabricated image sensor device is first provided, including a substrate 100 with a semiconductor layer 101 formed thereon, having a plurality of isolation regions 102 formed in the semiconductor layer 101 and defining a plurality of pixel regions thereon. A light-sensing device 104 for converting an incident light to photo-charges or light-sensing is formed in the semiconductor layer 101 in a corresponding pixel region but is not limited thereto. The light-sensing device 104 can also be formed over the semiconductor layer 100*c* of a corresponding pixel region (not shown). Examples of the light-sensing device 104 can be charge-coupled devices (CCD), CMOS image sensors (CIS) and/or optical microelectromechanical systems (MEMS), incorporating photodiodes in active or passive arrangements. Herein, the substrate 100 is a semiconductor on insulator (SOI) substrate, including a semiconductor layer 100*c* overlying an insulating layer 100*b* formed on a bulk substrate 100*a*, the bulk substrate 100*a* is a semiconductor substrate such as a silicon substrate. The insulating layer can be, for example, a silicon oxide layer. Herein, the semiconductor layer 100*c* can comprise, for example, silicon or silicon germanium, and the semiconductor layer 101 can comprise, for example, silicon of monocrystal. The semiconductor layer 101 can be formed by, for example, conventional epitaxial processes. In addition, the semiconductor layer 100*c* and the semiconductor layer 101 are further doped with the same conductivity type dopants, such as well known N or P type dopants, but have different doping concentrations therein. The semiconductor layer 100*c* preferably comprises a doping concentration greater than that of the semiconductor layer 101. For example, the semiconductor layer 100*c* has a doping concentration of about 1E16~1.5E20 atoms/$cm^2$ and the semiconductor layer 101 has a doping concentration of about 1E13~1E16 atoms/$cm^2$. The semiconductor layer 101 is formed at a thickness T2 of about 2~8 μm and the semiconductor layer 100*c* is formed with a thickness of about 500~10,000 Å. Typically, an overall thickness T1 of the SOI wafer 100 and the semiconductor layer 101 is about 500~900 μm.

Moreover, as shown in FIG. 2*a*, an interlayer dielectric (ILD) layer 106 is formed on the semiconductor layer 101 and covers the light-sensing device 104 thereon. An interconnect structure comprising dielectric layers 108, 112, 116, 118 and conductive elements 110, 114, 120 respectively provided on or between at predetermined locations of above dielectric layers in consideration of the underlying light-sensing devices 104 is provided over the ILD layer 106 so that the incident light projected on the light-sensing devices is not shielded by the existence of the conductive segments formed therein. The dielectric layer 122 here at a topmost place of the interconnecting structure may function as a passivation for protecting a device from moisture and scratching during post-manufacturing processes. Fabrication of the interconnect structure can be achieved by, for example, damascene process incorporating copper metal and low dielectric constant (low-k) dielectric materials and is well known by those skilled in the art.

Moreover, as shown in FIG. 2*a*, another substrate 200 is provided with or without a bond layer 202 formed thereon and the bond layer 202 is arranged to face the dielectric layer 122 formed over the substrate 100. The substrate 200 and the substrate 100 are next pushed toward each other to bond into a composite structure.

As shown in FIG. 2*b*, the composite structure comprising the substrates 200 and 100 is then inverted. The substrate 100 is then thinned by removing the bulk substrate 100*a* of the substrate 100, stopping on the insulating layer 100*b* by methods such as mechanical grinding, chemical mechanical polishing (CMP), dry etching and/or wet etching, thereby exposing the insulating layer 100*b* far from a back side of the semiconductor layer, 101 having devices or structures formed thereon, leaving a slightly thinned insulating layer 100*b*'. Herein, an overall thickness T1' including of the slightly thinned_insulating layer 100*b*', the semiconductor layer 100*c* and the semiconductor layer 101 is about 2~10 μm.

The slightly thinned semiconductor layer 100*b*' is formed by first thinning the bulk substrate 100*a* by a method such as, mechanical grinding, to a thickness of about 25~100 μm from a back side thereof. Next, an etching (not shown) such as a plasma etching or chemical etchant is performed to further reduce the bulk substrate 100*a* to remove the remaining bulk substrate 100*a*' and automatically stopping on and exposing a back side of the insulating layer, thereby leaving a slightly thinned insulating layer 100*b*', The chemical etchant used to removed the remaining bulk substrate is a mixture comprising acidic solution such as HF, $HNO_3$, $H_2O_2$, $H_3PO_4$, $CH_3COOH$, or $H_2SO_4$ and alkaline solution such as NaOH, KOH, $NH_3$, TMAH, showing a great etching selectivity difference of about 10~5000 between the bulk substrate 100*a* and insulating layer 100*b* since a material difference does exist therebetween.

Figure 1:
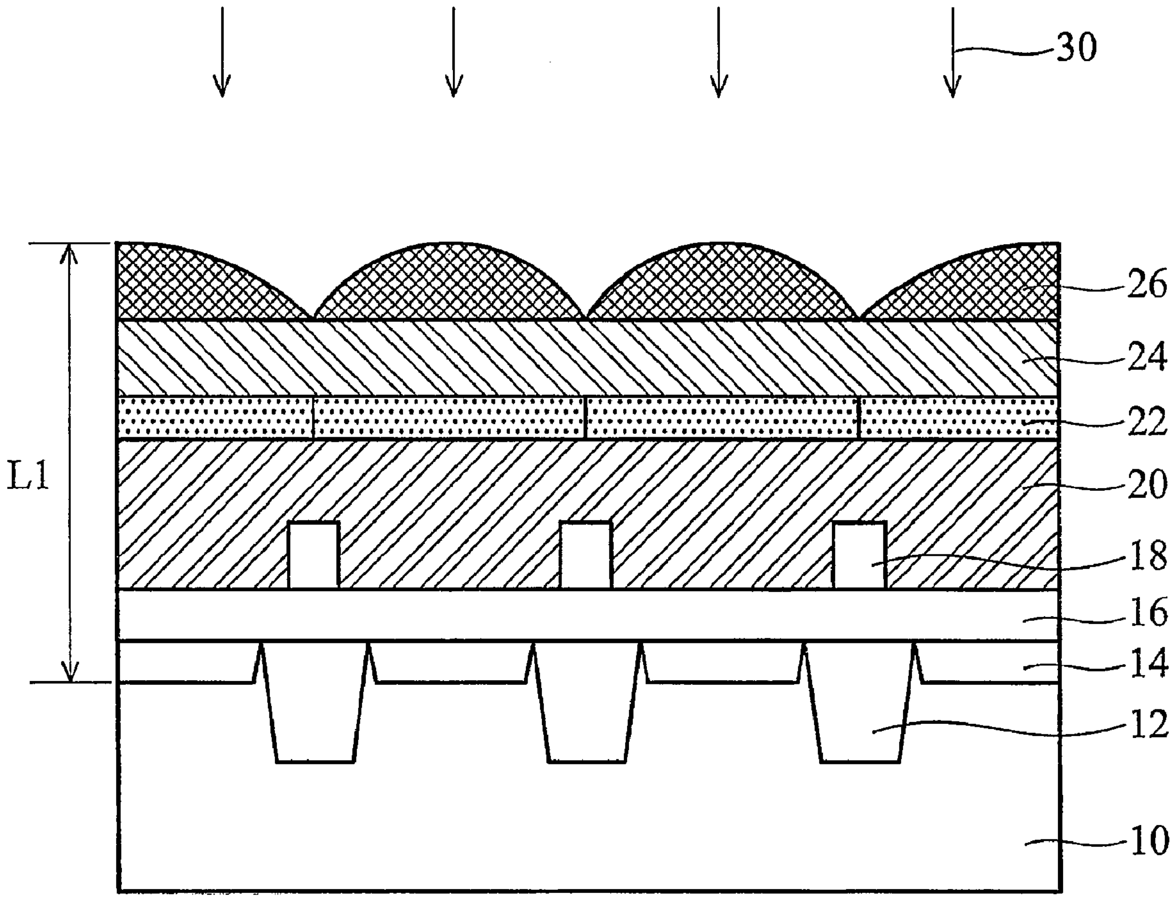
FIG. 1 is a cross section view showing a related art CMOS image sensor.

Next, as shown in FIG. 2*c*, an anti-reflection layer 600 is formed directly on the back side of the slightly thinned insulating layer 100*b*', having a thickness of about 100~5000 Å. The anti-reflection layer 600 may comprise dielectric materials formed by PVD or CVD methods, such as SiONx, SiNy or organic materials by spin coating, such as acrylic polymers, polyester, polystyrene, or polyimide. Preferably, the anti-reflection layer 600 has a refractive index (n) between 1.0 (in air) and 3.5 (in silicon substrate). Next, color filter array 300 having red, green and blue color filters is formed on the anti-reflection layer 600 and an optional over-coating layer (OCL) 302 is next provided on color filter array 300, thereby providing a planarized surface. A plurality of dome shaped microlens 304 is next formed on the OCL 302, substantially corresponding to each of the pixel regions from a back side thereof. Therefore, incident light 400 can be projected onto the light-sensing devices 104 via passing along an optical path L2 which is relatively shorter than that in the CMOS image sensor illustrated in FIG. 1 since fewer structures and no metal interconnects are now formed between the light-sensing devices 104 and the microlenses 304. Therefore, an image sensor device having such structures can be formed with reduced optical interference and improved quantum efficiency.

Figure 3A:
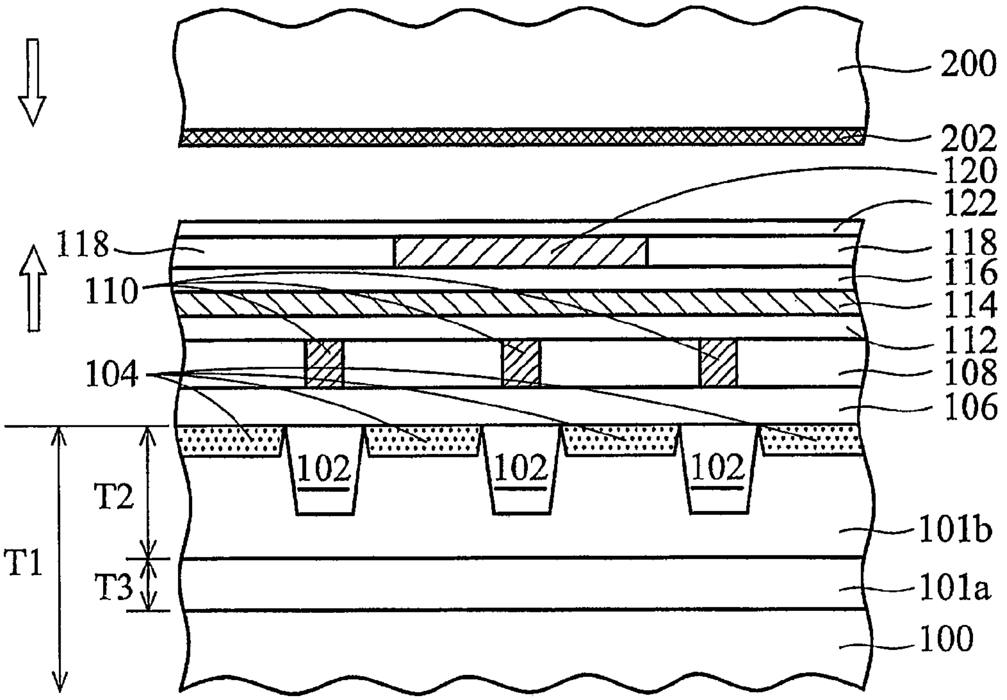
FIGS. 3*a*-3*c* are schematic cross sections showing another embodiment of a method for fabricating an image sensor device.
Figure 3B:
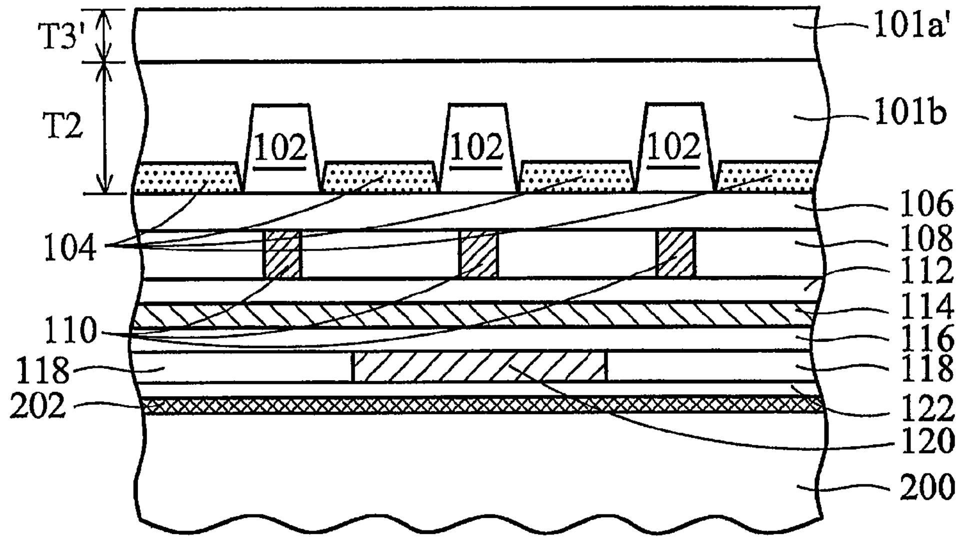
Figure 3C:
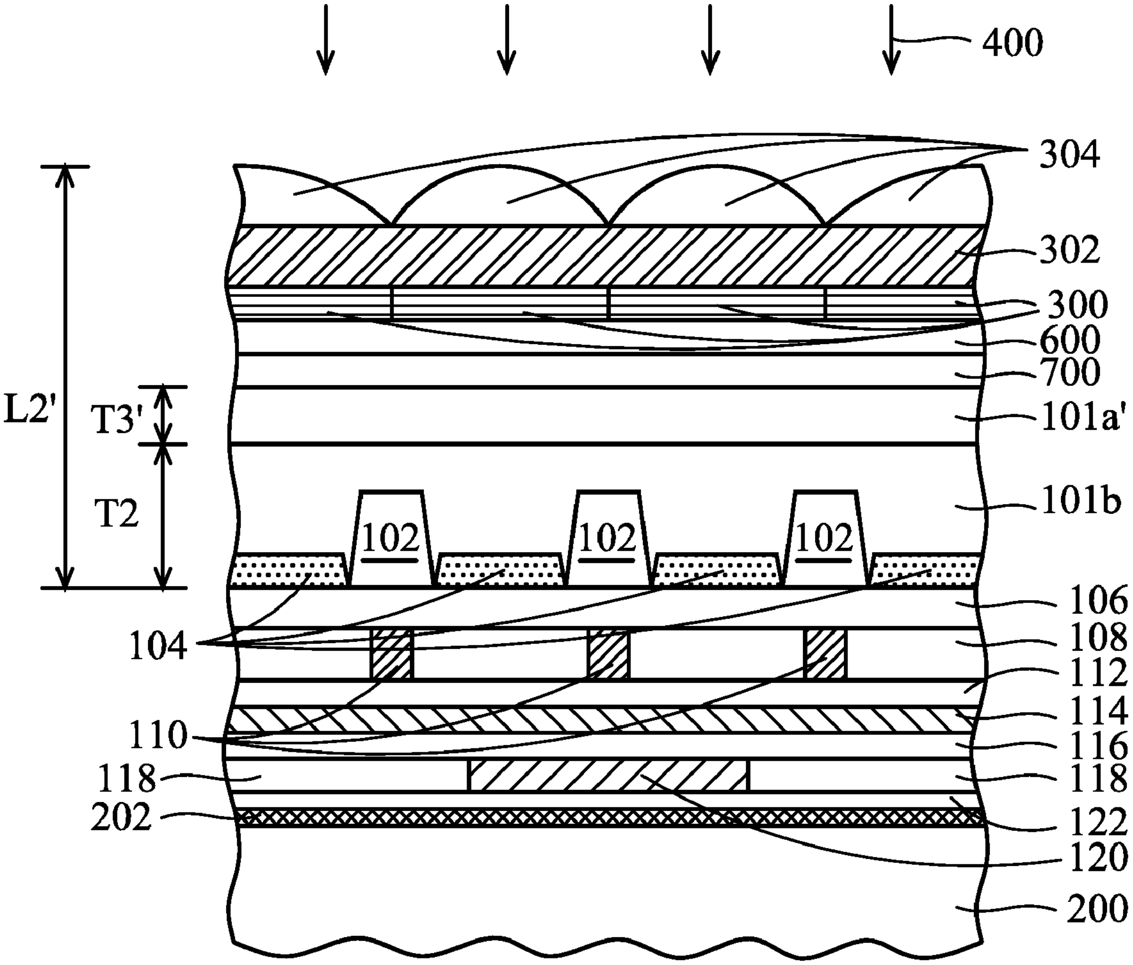

FIGS. 3*a*-3*c* are schematic cross sections showing another embodiment of a method for fabricating an image sensor device similar to that illustrated in FIGS. 2*a*-2*c*. Herein, the same numerals represent same elements and only the differences are described in the following.

As shown in FIG. 3*a*, a nearly fabricated image sensor device is first provided. It is noted that a substrate 100 is now provided with two semiconductor layers 101*a* and 101*b* sequentially formed thereon. The light-sensing device 104 for converting an incident light to photo-charges or light-sensing is now formed in the semiconductor layer 101*b* in a corresponding pixel region but is not limited thereto. The light-sensing device 104 can also be formed over the semiconductor layer 101*a* of corresponding pixel region (not shown). Examples of the light-sensing device 104 can be charge-coupled devices (CCD), CMOS image sensors (CIS) and/or optical microelectromechanical systems (MEMS), incorporating photodiodes in active or passive arrangements. Herein, the substrate 100 is a bulk substrate comprising, for example, silicon and the semiconductor layers 101*a*, 101*b* can comprise, for example, silicon germanium or silicon formed by conventional epitaxial processes. Also, the substrate 100 and semiconductor layers 101*a*, 101*b* are doped with same conductivity type dopants, such as well known N or P type dopants, but have different doping concentrations therein. Herein, the substrate 100 preferably comprises a doping concentration less than that of the semiconductor layers 101*a*, and semiconductor layers 101*a* comprises a doping concentration greater than that of the semiconductor layers 101*b*. For example, the substrate 100 has a doping concentration of about 1E13~1E16 atoms/$cm^2$, the semiconductor layer 101*a* has a doping concentration of about 1E16~1.5E20 atoms/$cm^2$, and the semiconductor layer 101*b* has a doping concentration of about 1E13~1E16 atoms/$cm^2$. Also, as shown in FIG. 3*a*, the semiconductor layer 101*b* is formed at a thickness T2 of about 2~8 μm, the semiconductor layer 101*a* is formed at a thickness T3 of about 1,000~50,000 Å. Typically, an overall thickness T1 including the substrate 100 and the semiconductor layers 101*a*, 101*b* is about 500~900 μm.

Moreover, as shown in FIG. 3*a*, an interlayer dielectric (ILD) layer 106 is formed on the semiconductor layer 101*b* and covers the light-sensing device 104 thereon. An interconnect structure comprising dielectric layers 108, 112, 116, 118 and conductive elements 110, 114, 120 respectively provided on or between at predetermined locations of above dielectric layers in consideration of the underlying light-sensing devices 104 is provided over the ILD layer 106 so that the incident light projected on the light-sensing devices is not shielded by the existence of the conductive segments formed therein. The dielectric layer 122 here at a topmost place of the interconnecting structure may function as a passivation for protecting a device from moisture and scratching during post-manufacturing processes. Fabrication of the interconnect structure can be achieved by, for example, damascene process incorporating copper metal and low dielectric constant (low-k) dielectric materials and is well known by those skilled in the art.

Moreover, as shown in FIG. 3*a*, another substrate 200 is provided with or without a bond layer 202 formed thereon and the bond layer 202 is arranged to face the passivation layer 122 formed over the substrate 100. The substrate 200 and the substrate 100 is next push toward each other to bond into a composite structure.

As shown in FIG. 3*b*, the composite structure comprising the substrates 200 and 100, and the semiconductor layers 101*a* and 101*b* illustrated in FIG. 3*a* is inverted. The substrate 100 (shown in FIG. 3*a*) is then removed by methods such as mechanical grinding, chemical mechanical polishing (CMP) dry etching and/or wet etching, thereby exposing a back side of the semiconductor layer 101*a*, where no device or structures formed thereon, leaving a slightly thinned semiconductor layer 101*a'*.

The slightly thinned semiconductor layer 101*a*' is formed by first thinning the substrate 100 by a method such as, mechanical grinding, to a thickness of about 25~100 μm. Next, an etching (not shown) such as a plasma etching or wet chemicals is performed to further reduce the substrate 100 to a thickness of about 5~10 μm. Next, another etching (not shown) is performed, incorporating etchant such as alkaline solution, to remove the remaining substrate and automatically stopping on and exposing a back side of the semiconductor layer 101*a*, thereby leaving a slightly thinned semiconductor layer 101*a*'. The alkaline solution used to removed the remaining substrate is a mixture comprising NaOH, KOH, NH3, TMAH, etc. and showing a great etching selectivity difference of about 1.5~50 between the semiconductor layer 101*a* and the substrate 100 since a doping concentration difference does exist therebetween.

Next, as shown in FIG. 3*c*, a buffer layer 700 and an anti-reflection layer 600 are sequentially formed on the back side of the slight thinned semiconductor layer 101*a*', having a thickness of about 100~1000 Å and 100~5000 Å, respectively. The anti-reflection layer 600 may comprise dielectric materials formed by PVD or CVD methods, such as SiNx, SiONy or organic materials by spin coating, such as acrylic polymers, polyester, polystyrene, polyimide, and the buffer layer 700 may comprise $SiO_2$ or SiONz for releasing stresses formed between the semiconductor layer 101*a*' and the anti-reflection layer 600. Preferably, the anti-reflection layer 600 has a refractive index (n) between 1.0 (in air)~3.5 (in silicon substrate). Next, color filter array 300 having red, green and blue color filters is formed on the anti-reflection layer 600 and an optional over-coating layer (OCL) 302 is next provided on color filter array 300, thereby providing a planarized surface. A plurality of dome shaped micro lenses 304 are next formed on the OCL 302, substantially corresponding to each of the pixel regions from a backside thereof. Therefore, incident light 400 can be projected onto the light-sensing device 104 via passing along an optical path L2' which is still relatively shorter than that in the CMOS image sensor illustrated in FIG. 1 since fewer internal structures and no metal interconnects are now formed between the light-sensing device 104 and the microlens 304. Therefore, an image sensor device having such structures can be formed with reduced optical interferences and improved quantum efficiency.

Figure 4A:
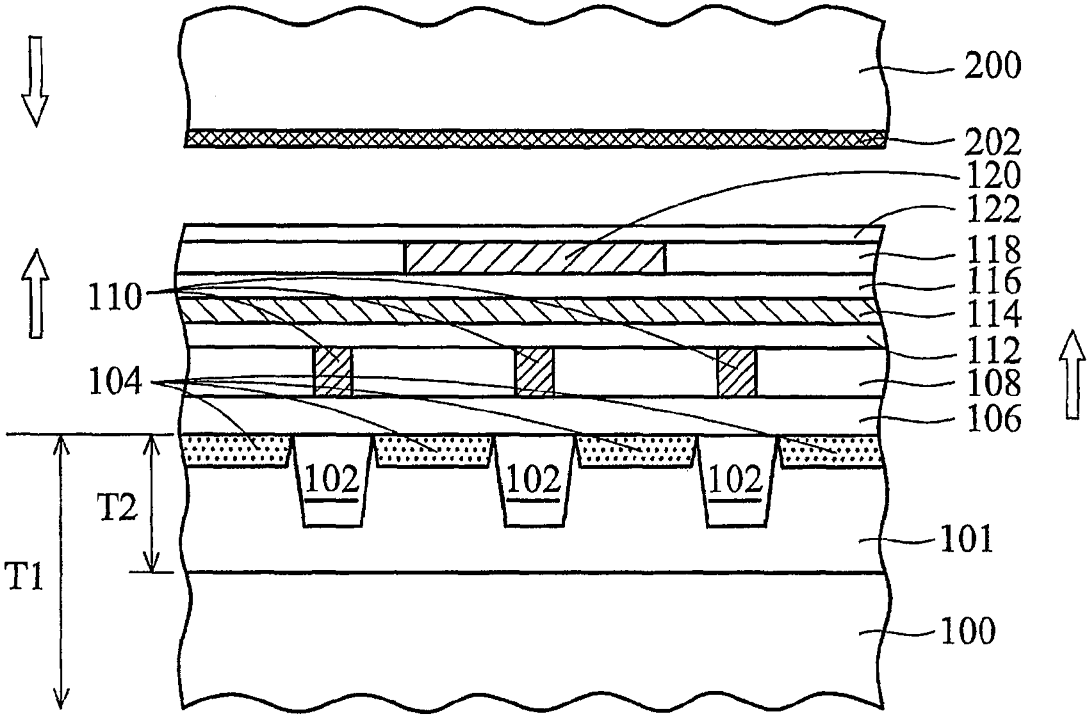
FIGS. 4*a*-4*c* are schematic cross sections showing yet another embodiment of a method for fabricating an image sensor device.
Figure 4B:
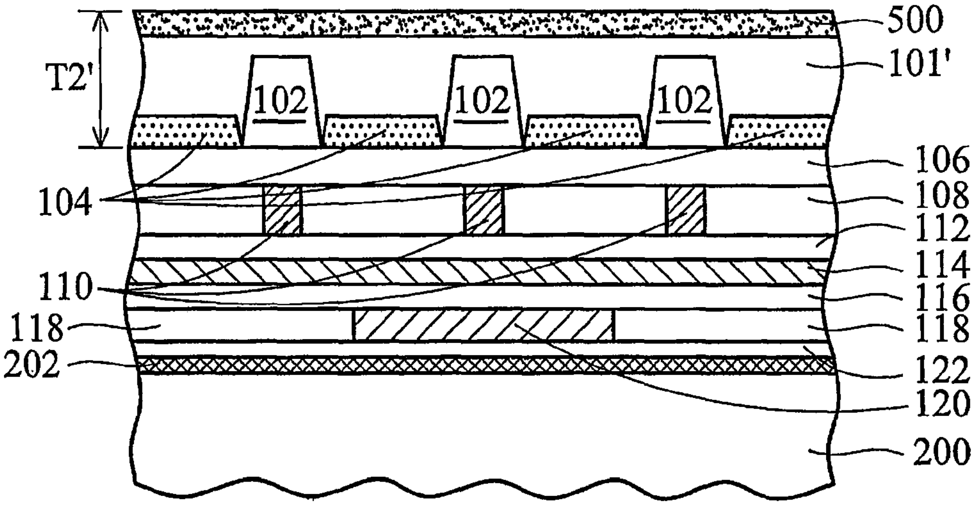
Figure 4C:
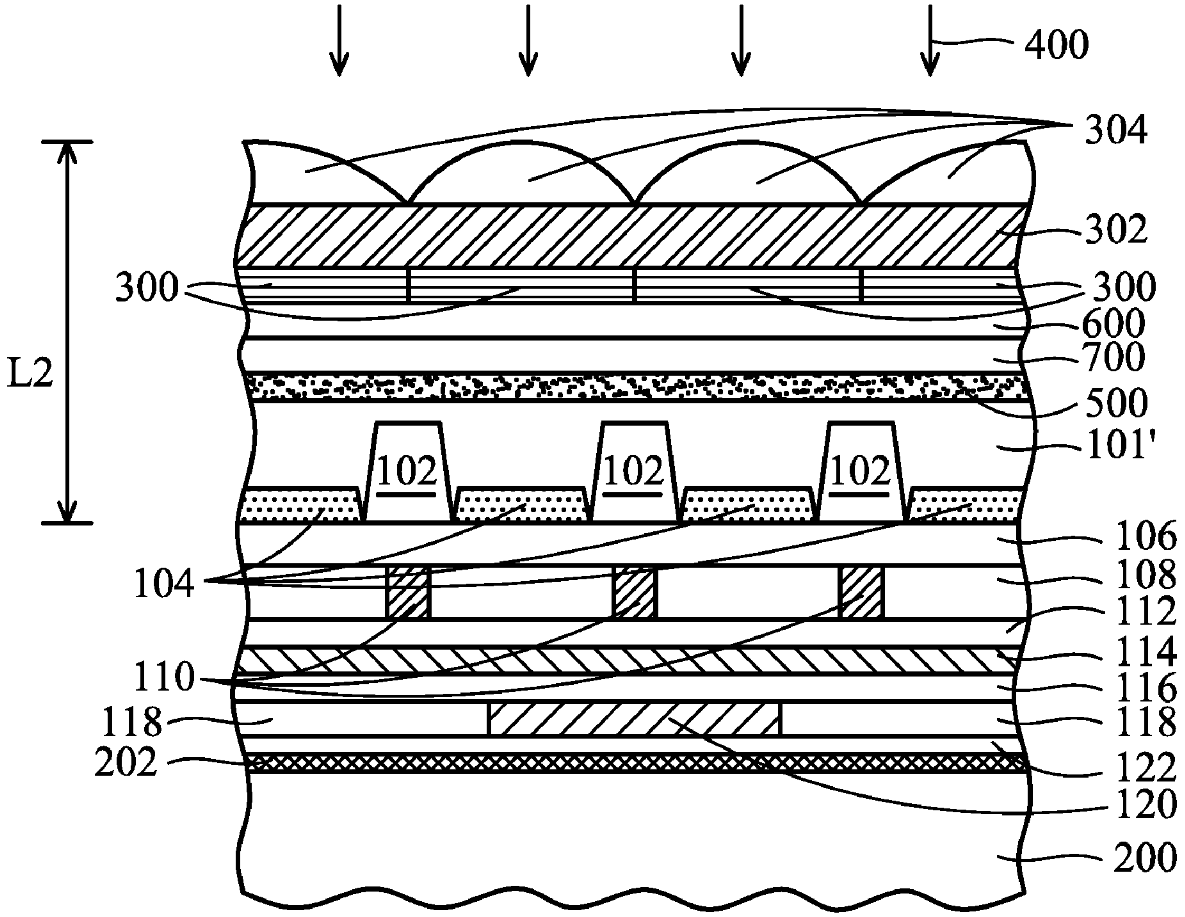

FIGS. 4*a*-4*c* are schematic cross sections showing yet another embodiment of a method for fabricating an image sensor device similar to that illustrated in FIGS. 2*a*-2*c*. Herein, the same numerals represent same elements and only the differences are described in the following.

As shown in FIG. 4*a*, a nearly fabricated image sensor device is first provided, including a substrate 100 with a semiconductor layer 101 formed thereon, having a plurality of isolation regions 102 formed therein and defining a plurality of pixel regions thereon. A light-sensing device 104 for converting an incident light to photo-charges or light-sensing is formed in the substrate 101 in a corresponding pixel region but is not limited thereto. The light-sensing device 104 can also be formed over the substrate 100 of a corresponding pixel region (not shown). Examples of the light-sensing device 104 can be charge-coupled devices (CCD), CMOS image sensors (CIS) and/or optical microelectromechanical systems (MEMS), incorporating photodiodes in active or passive arrangements. Herein, the substrate 100 is a bulk substrate comprising, for example, silicon, and the semiconductor layer 101 can comprise, for example, silicon of monocrystal formed by conventional epitaxial processes. In addition, the substrate 100 and the semiconductor layer 101 are further doped with the same conductivity type dopants, such as well known N or P type dopants, but have different doping concentrations therein. The substrate 100 preferably comprises a doping concentration greater than that of the semiconductor layer 101. For example, the substrate 100 has a doping concentration of about 1E16~1.5E20 atoms/$cm^2$ and the semiconductor layer 101 has a doping concentration of about 1E13~1E16 atoms/$cm^2$. The semiconductor layer 101 is formed at a thickness T2 of about 2~10 μm. Typically, an overall thickness T1 including of the substrate 100 and the semiconductor layer 101 is about 500~900 μm.

Moreover, as shown in FIG. 4*a*, an interlayer dielectric (ILD) layer 106 is formed on the semiconductor layer 101 and covers the light-sensing device 104 thereon. An interconnect structure comprising dielectric layers 108, 112, 116, 118 and conductive elements 110, 114, 120 respectively provided on or between at predetermined locations of above dielectric layers in consideration of the underlying light-sensing devices 104 is provided over the ILD layer 106 so that the incident light projected on the light-sensing devices is not shielded by the existence of the conductive segments formed therein. The dielectric layer 122 here at a topmost place of the interconnecting structure may function as a passivation for protecting a device from moisture and scratching during post-manufacturing processes. Fabrication of the interconnect structure can be achieved by, for example, damascene process incorporating copper metal and low dielectric constant (low-k) dielectric materials and is well known by those skilled in the art.

Moreover, as shown in FIG. 4*a*, another substrate 200 is provided with or without a bond layer 202 formed thereon and the bond layer 202 is arranged to face the passivation layer 122 formed over the substrate 100. The substrate 200 and the substrate 100 are next pushed toward each other to bond into a composite structure.

As shown in FIG. 4*b*, the composite structure comprising the substrates 200 and 100 is then inverted. The substrate 100 is then removed, thereby exposing a backside of the semiconductor layer 101, leaving a slightly thinned semiconductor layer 101'. The slightly thinned semiconductor layer 101' is formed by first thinning the substrate 100 by a method such as mechanical grinding, to a thickness of about 25~100 μm from a back side thereof. Next, an etching (not shown) such as a plasma etching or wet chemicals is performed to further reduce the substrate 100 to a thickness of about 5-10 nm. Next, another etching (not shown) is performed, incorporating etchant such as acidic solution, to remove the remaining substrate and automatically stopping on and exposing a back side of the semiconductor layer 101, thereby leaving a slightly thinned semiconductor layer 101'. The acidic solution used to removed the remaining substrate is a mixture comprising HF, $HNO_3$, $H_2O_2$, $H_3PO_4$, $CH_3COOH$, $H_2SO_4$ and showing a great etching selectivity difference of about 5~300 between the semiconductor layer 101 and the substrate 100 since a doping concentration difference does exist therebetween. Next, an ion implantation and thermal anneal (both not shown) are sequentially performed on the back side surface of the slightly thinned semiconductor layer 101', thereby forming a well region 500 near the back side surface of the slightly thinned semiconductor layer 101'. Typically, the well region 500 is formed with a depth of about 200-5000 Å from the back side surface of the slightly thinned semiconductor layer 101', having a doping concentration of about 1E16~5E19 atoms/$cm^2$, which is greater than that of the semiconductor layer 101'.

Next, as shown in FIG. 4*c*, a buffer layer 700 and an anti-reflection layer 600 are sequentially formed on the back side of the slight thinned semiconductor layer 101*a*', overlying the well region 500 thereof and having a thickness of about 100~1000 Å and 100~5000 Å, respectively. The anti-reflection layer 600 may comprise dielectric materials formed by PVD or CVD methods, such as SiONx, SiNy or organic materials by spin coating, such as acrylic polymers, polyester, polystyrene, polyimide, and the buffer layer 700 may comprise SiO2, SiONz, for releasing stresses formed between the semiconductor layer 101*a*' and the anti-reflection layer 600. Preferably, the anti-reflection layer 600 has a refractive index (n) between 1.0 (in air)~3.5 (in silicon substrate). Next, color filter array 300 having red, green and blue color filters is formed on the anti-reflection layer 600 and an optional overcoating layer (OCL) 302 is next provided on color filter array 300, thereby providing a planarized surface. A plurality of dome shaped microlens 304 is next formed on the OCL 302, substantially corresponding to each of the pixel regions from a backside thereof. Therefore, incident light 400 can be projected onto the light-sensing devices 104 via passing along an optical path L2 which is relatively shorter than that in the CMOS image sensor illustrated in FIG. 1 since fewer structures and no metal interconnects are now formed between the light-sensing devices 104 and the microlenses 304. Therefore, an image sensor device having such structures can be formed with reduced optical interference and improved quantum efficiency.

Referring to the image sensor device respectively illustrated in FIGS. 2*c*, 3*c* and 4*c*, since a backside of a semiconductor substrate/layer where comprising the light-sensing devices are exposed and a color filter layer and microlenses are formed thereon, incident light can be projected onto the light-sensing devices via passing along an optical path relatively shorter than that of the conventional light-sensing devices. Therefore, reduced optical interference and improved quantum efficiency of the light-sensing device formed within such image sensor device can be achieved. This is desired especially when a size of the light-sensing device is further reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensor device, comprising:

a support substrate;

a passivation structure formed over the support substrate;

an interconnect structure formed over the passivation structure;

a first semiconductor layer formed over the interconnect structure, having a first and second surfaces, wherein the first and second surfaces are opposing surfaces and the second surface contacts the interconnect structure;

at least one light-sensing device formed over/in the first semiconductor layer from the first surface thereof;

a second semiconductor layer formed over the first semiconductor layer;

a color filter layer formed over the second semiconductor layer; and at least one micro lens formed over the color filter layer.

2. The image sensor device as claimed in claim 1, wherein the first semiconductor layer comprises a first doping concentration and the second layer comprises a second doping concentration different from the first doping concentration.

3. The image sensor device as claimed in claim 2, wherein the second doping concentration is greater than the first doping concentration.

4. The image sensor device as claimed in claim 2, wherein the first doping concentration is about 1E13~1E16 atoms/$cm^2$ and the second doping concentration is about 1E16~1.5E20 atoms/$cm^2$.

5. The image sensor device as claimed in claim 1, further comprising an insulating layer and an anti-reflection layer formed between the second semiconductor layer and the color filter layer.

6. The image sensor device as claimed in claim 1, further comprising a surface coating layer formed between the color filter layer and the at least one micro lens.

7. The image sensor device as claimed in claim 1, wherein the image sensor device is fabricated by the following steps, comprising:

providing the first semiconductor layer;

forming the at least one light-sensing device over/in the first semiconductor layer from the first surface thereof;

forming the interconnect structure over of the first semiconductor layer from the first surface thereof, covering the at least one light-sensing device;

forming the passivation structure over the interconnect structure, covering the interconnect structure;

bonding the support substrate with the passivation structure;

forming the color filter layer over the second semiconductor layer; and forming the at least one micro lens over the color filter layer.

8. The image sensor device as claimed in claim 7, further comprising formation of a buffer layer and an anti-reflection layer over the second surface of the first semiconductor layer prior to formation of the color filter layer over the second semiconductor layer.

9. The image sensor device as claimed in claim 7, prior to forming the at least one microlens over the color filter layer, further comprising the step of forming a surface coating layer over the color filter layer.

10. The image sensor device as claimed in claim 1, wherein the image sensor device is fabricated by the following steps:

forming a composite structure comprising the following steps:

providing a first substrate having the first and second semiconductor layers sequentially stacked on the substrate, wherein the first substrate, and the first and second semiconductor layers are formed with same conductivity but different doping concentrations and the first semiconductor layer has the first surface contacting the second semiconductor layer and the second surface contacting the first substrate;

forming the at least one light-sensing device over/in the first semiconductor layer;

forming the interconnect structure over the first substrate, covering the light-sensing device;

forming the passivation structure over the interconnect structure;

bonding the support substrate with the passivation structure;

thinning the first substrate and exposing the second surface of the first semiconductor layer;

inverting the above-formed composite structure, before performing the following steps:

forming the color filter layer over the second semiconductor layer; and forming the at least one microlens over the color filter layer.

11. The image sensor device as claimed in claim 10, further comprising formation of a buffer layer and an anti-reflection layer over the second surface of the first semiconductor layer prior to formation of the color filter layer over the second semiconductor layer.

12. The image sensor device as claimed in claim 10, prior to formation of the at least one microlens over the color filter layer, further comprising the step of forming a surface coating layer over the color filter layer.

13. The image sensor device as claimed in claim 5, wherein the image sensor device is fabricated by following steps, comprising:

providing a film stack of the insulating layer, the second semiconductor layer, and the first semiconductor layer, wherein the first and second semiconductor layers are formed with same conductivity but different doping concentrations, and the insulating layer contacts the second semiconductor layer;

forming the at least one light-sensing device over/in the first semiconductor layer from the first surface thereof;

forming the interconnect structure over the first semiconductor layer, covering the light-sensing device;

forming the passivation structure over the interconnect structure, bonding the support substrate with the passivation structure;

forming the color filter layer over the insulating layer; and forming the at least one microlens over the color filter layer.

14. The image sensor device as claimed in claim 13, further comprising formation of the anti-reflection layer over the insulating layer prior to formation of the color filter layer over the insulating layer from the second surface thereof.

15. The image sensor device as claimed in claim 13, prior to formation of the at least one micro lens over the color filter layer, further comprising the step of forming a surface coating layer over the color filter layer.

16. The image sensor device as claimed in claim 1, wherein the light-sensing device is a CCD, CIS or optical MEMS device.

* * * * *

UNITED STATES PATENT AND TRADEMARK OFFICE

CERTIFICATE OF CORRECTION

PATENT NO. : 7,709,872 B2
APPLICATION NO. : 11/531290
DATED : May 4, 2010
INVENTOR(S) : Shiau et al.

It is certified that error appears in the above-identified patent and that said Letters Patent is hereby corrected as shown below:

In the Specifications:
Column 8, line 13 should read "reduce the substrate 100 to a thickness of about 5-10μm."

Signed and Sealed this

Ninth Day of November, 2010

David J. Kappos
*Director of the United States Patent and Trademark Office*